(12) United States Patent
Makishima et al.

(10) Patent No.: US 12,532,753 B2
(45) Date of Patent: Jan. 20, 2026

(54) SWITCHING DEVICE, SEMICONDUCTOR DEVICE, AND SWITCHING DEVICE MANUFACTURING METHOD

(71) Applicant: Mitsubishi Electric Corporation, Tokyo (JP)

(72) Inventors: Hitoshi Makishima, Tokyo (JP); Yuki Matsutaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 522 days.

(21) Appl. No.: 17/715,070

(22) Filed: Apr. 7, 2022

(65) Prior Publication Data

US 2022/0384318 A1 Dec. 1, 2022

(30) Foreign Application Priority Data

May 28, 2021 (JP) ................................. 2021-089994

(51) Int. Cl.
*H01L 23/495* (2006.01)
*H01L 23/00* (2006.01)
(Continued)

(52) U.S. Cl.
CPC ........ *H01L 23/49562* (2013.01); *H01L 23/36* (2013.01); *H01L 23/49503* (2013.01);
(Continued)

(58) Field of Classification Search
CPC . H01L 23/045–051; H01L 23/055–057; H01L 23/50; H01L 23/4951;
(Continued)

(56) References Cited

U.S. PATENT DOCUMENTS 7,443,014 B2 * 10/2008 Otremba ........... H01L 23/49575
257/676
8,766,430 B2 7/2014 Otremba et al.
(Continued)

FOREIGN PATENT DOCUMENTS

CN 103515346 A 1/2014
JP 2005-327752 A 11/2005
(Continued)

OTHER PUBLICATIONS

Ono, Semiconductor Module, 2019, machine translation of JP 2019029410 A, pp. 1-7. (Year: 2019).*
(Continued)

*Primary Examiner* — Natalia A Gondarenko
(74) *Attorney, Agent, or Firm* — Studebaker Brackett PLLC

(57) ABSTRACT

A switching device includes: a switching element; a die pad; a gate terminal; a first power terminal integral with the die pad; and a second power terminal, the gate terminal, the first power terminal, and the second power terminal are located on a side of a first direction of the die pad, the gate terminal, the first power terminal, and the second power terminal are arranged in a second direction orthogonal to the first direction in the following order: the gate terminal, the first power terminal, and the second power terminal or the second power terminal, the first power terminal, and the gate terminal, the switching element includes a first and a second gate pad, the first gate pad is closer to the gate terminal than the second gate pad is, the second gate pad is closer to the second power terminal than the first gate pad is.

23 Claims, 9 Drawing Sheets

(51) Int. Cl.
  *H01L 23/36* (2006.01)
  *H10D 62/832* (2025.01)
(52) U.S. Cl.
  CPC .............. *H01L 24/48* (2013.01); *H01L 24/97* (2013.01); *H10D 62/8325* (2025.01); *H01L 2224/48175* (2013.01)
(58) Field of Classification Search
  CPC ......... H01L 23/49575; H01L 23/49562; H01L 23/49541; H01L 23/3107; H01L 2924/182; H01L 2924/1424; H01L 2224/48137; H01L 2224/48245; H01L 2224/40237; H01L 2224/40257; H01L 2224/48238; H01L 2224/48257; H01L 2224/48247; H01L 2224/4903; H01L 29/1608; H01L 2924/00014; H01L 2924/181; H01L 2224/48175; H01L 2224/04042; H01L 24/06; H01L 24/48; H01L 24/49; H01L 24/97; H01L 21/60; H01L 25/072; H01L 25/11; H01L 25/0655; H01L 23/49503–49513; H01L 23/495–49596; H01L 23/49861; H01L 23/498–49866; H01L 23/36; H01L 23/49; H10D 62/393; H10D 62/8325; H10D 30/025; H10D 30/0291; H10D 30/477; H10D 30/63; H10D 30/66
  USPC ....... 257/192, 368, 369, 355, 472, 476, 697, 257/706
  See application file for complete search history.

(56) References Cited

U.S. PATENT DOCUMENTS

| | | |
|---|---|---|
| 2010/0276798 A1 | 11/2010 | Satou et al. |
| 2011/0215746 A1* | 9/2011 | Ikoshi .................... H03K 3/021 |
| | | 327/333 |
| 2012/0149149 A1* | 6/2012 | Liu ........................ H01L 24/36 |
| | | 438/107 |
| 2012/0248592 A1 | 10/2012 | Hata et al. |
| 2013/0249008 A1 | 9/2013 | Sugimura et al. |
| 2013/0334677 A1 | 12/2013 | Otremba et al. |
| 2017/0221803 A1* | 8/2017 | Kamachi ................. H01L 24/85 |
| 2017/0338201 A1* | 11/2017 | Shimakawa ........ H01L 25/0655 |
| 2020/0111727 A1* | 4/2020 | Tsuno ..................... H01L 24/06 |
| 2022/0148949 A1* | 5/2022 | Hayashi ............. H01L 23/3121 |

FOREIGN PATENT DOCUMENTS

| | | | |
|---|---|---|---|
| JP | 2013-197331 A | 9/2013 | |
| JP | 2019029410 A | * 2/2019 | ... H01L 2223/48247 |

OTHER PUBLICATIONS

An Office Action mailed by China National Intellectual Property Administration on Aug. 1, 2024, which corresponds to Chinese Patent Application No. 202210566942.0 and is related to U.S. Appl. No. 17/715,070; with. English language translation.

An Office Action; "Notice of Reasons for Refusal," mailed by the Japanese Patent Office on Apr. 2, 2024, which corresponds to Japanese Patent Application No. 2021-089994 and is related to U.S. Appl. No. 17/715,070; with English language translation.

An Office Action; mailed by the China National Intellectual Property Administration of the People's Republic of China on Dec. 2, 2024, which corresponds to Chinese Patent Application No. 202210566942.0, and is related to U.S. Appl. No. 17/715,070.

An Office Action mailed by China National Intellectual Property Administration on Feb. 6, 2025, which corresponds to Chinese Patent Application No. 202210566942.0 and is related to U.S. Appl. No. 17/715,070; with English language translation.

Office Action issued in DE 10 2022 112 559.9; mailed by the German Patent and Trademark Office on May 30, 2025.

* cited by examiner

SWITCHING DEVICE, SEMICONDUCTOR DEVICE, AND SWITCHING DEVICE MANUFACTURING METHOD

BACKGROUND OF THE INVENTION

Field of the Invention

The present disclosure relates to switching devices, semiconductor devices, and switching device manufacturing methods.

Description of the Background Art

A semiconductor device including a source terminal, a drain terminal and a gate terminal is disclosed in Japanese Patent Application Laid-Open No. 2005-327752, for example.

Switching devices differing in layout of terminals are sometimes required depending on a usage condition. A change in layout of terminals of a switching device can lead to a change in properties.

SUMMARY

It is an object of the present disclosure to provide a switching device capable of suppressing a change in properties when the layout of terminals is changed.

A switching device according to a first aspect of the present disclosure includes: a switching element; a die pad; a gate terminal non-integral with the die pad; a first power terminal integral with the die pad; and a second power terminal non-integral with the die pad. The switching element is disposed over the die pad. A lower surface of the switching element and the die pad are electrically connected. The gate terminal, the first power terminal, and the second power terminal are located on a side of a first direction of the die pad in plan view. The gate terminal, the first power terminal, and the second power terminal are arranged in a second direction orthogonal to the first direction in plan view in the following order: the gate terminal, the first power terminal, and the second power terminal or the second power terminal, the first power terminal, and the gate terminal. The switching element includes a first gate pad and a second gate pad on an upper surface thereof. The first gate pad is closer to the gate terminal than the second gate pad is. The second gate pad is closer to the second power terminal than the first gate pad is. The first gate pad is connected to the gate terminal by a wire. The second gate pad is not connected to the gate terminal or the second power terminal.

According to the present disclosure, a switching device capable of reducing cost required for the manufacture of semiconductor devices differing in layout of terminals is provided.

These and other objects, features, aspects and advantages of the present invention will become more apparent from the following detailed description of the present invention when taken in conjunction with the accompanying drawings.

DESCRIPTION OF THE PREFERRED EMBODIMENTS

A. Embodiment 1

<A-1. Configuration>

Figure 7:
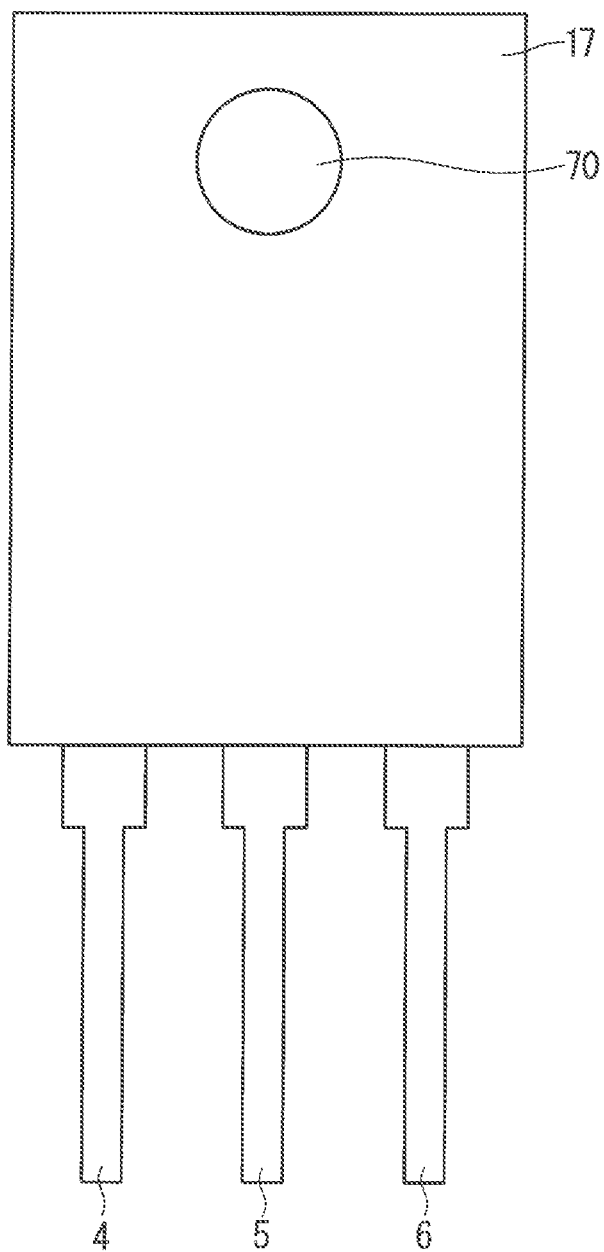
FIG. 7 shows one example of the switching device in Embodiment 1.
Figure 8:
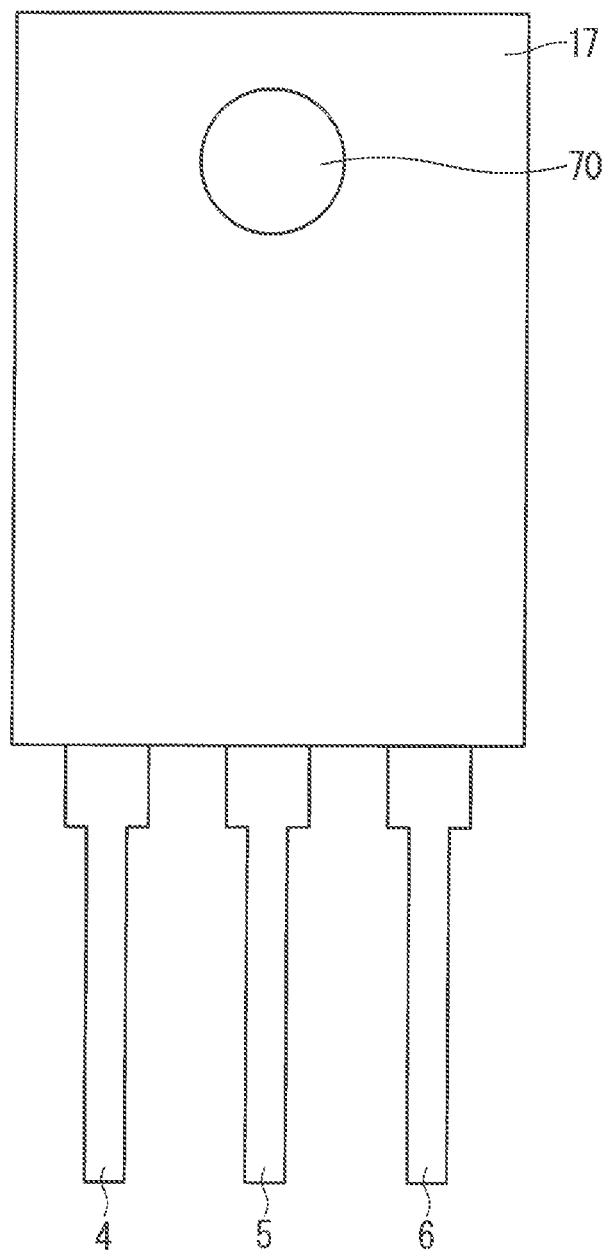
FIG. 8 shows one example of the switching device in Embodiment 1.

FIGS. 7 and 8 respectively show a switching device 11a and a switching device 11b each being a switching device in the present embodiment.

Figure 1:
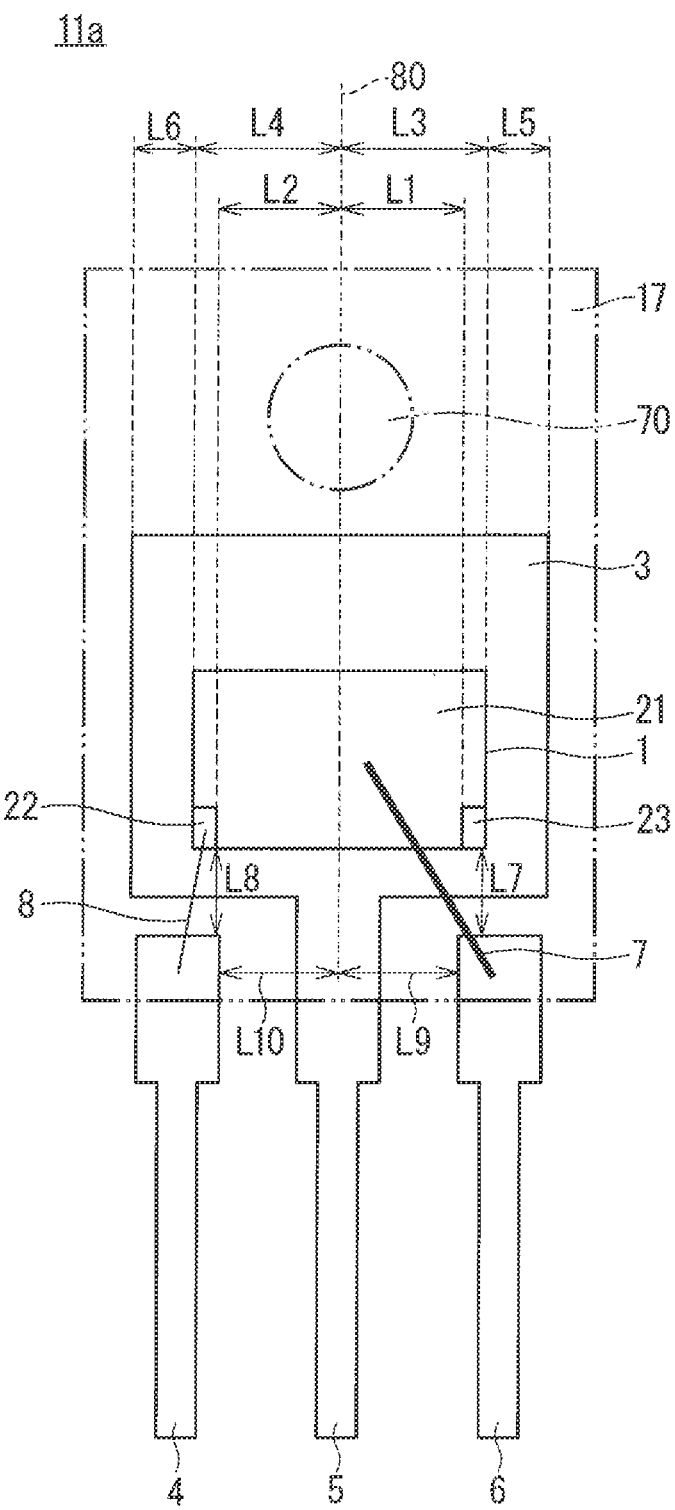
FIG. 1 shows one example of a switching device in Embodiment 1.
Figure 2:
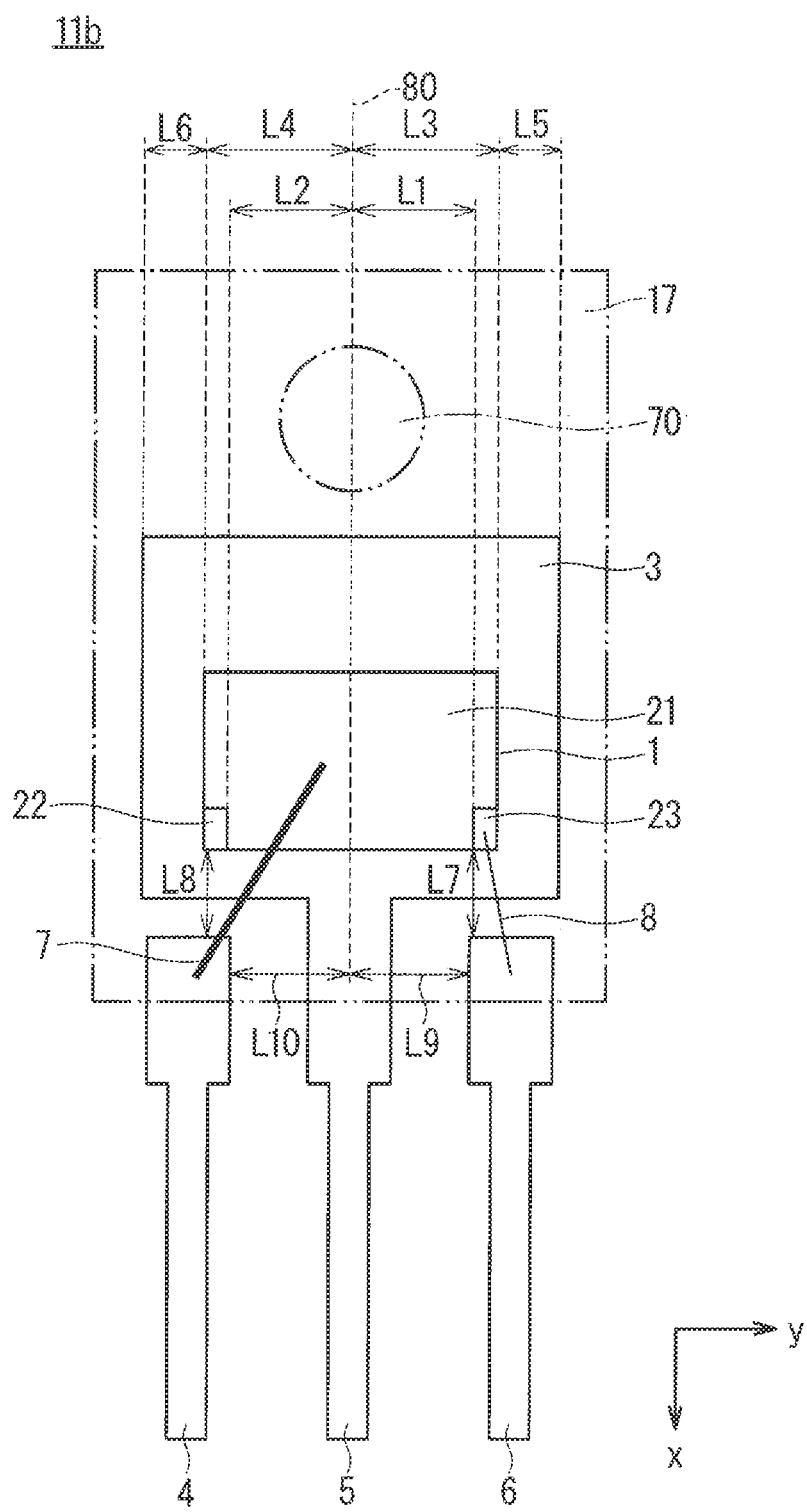
FIG. 2 shows one example of the switching device in Embodiment 1.

FIGS. 1 and 2 respectively show the switching device 11a and the switching device 11b without a sealing material 17 thereof to show an interior of the sealing material 17. The sealing material 17 is shown in an alternate long and two short dashes line in each of FIGS. 1 and 2. The sealing material 17 has a hole 70 used to secure the switching device 11a or the switching device 11b to a heat sink and the like.

Each of the switching device 11a and the switching device 11b includes a switching element 1, a die pad 3, a terminal 4, a terminal 5 integral with the die pad 3, and a terminal 6. The die pad 3 and the terminal 4 are non-integral. The die pad 3 and the terminal 6 are non-integral.

The terminal 4, the terminal 5, and the terminal 6 are located on a side of a first direction (i.e., an x direction in FIG. 1 or FIG. 2) of the die pad 3. The terminal 4, the terminal 5, and the terminal 6 protrude out of the sealing material 17 from a side of the first direction thereof. The terminal 4, the terminal 5, and the terminal 6 extend along the first direction. The terminal 4, the terminal 5, and the terminal 6 protrude from the sealing material 17 in the first direction.

The switching element 1, the die pad 3, a portion of the terminal 4, a portion of the terminal 5, and a portion of the terminal 6 are sealed by the sealing material 17. The sealing material 17 is resin, for example.

The switching element 1 is disposed over the die pad 3. The switching element 1 is disposed over the die pad 3 through a bonding material, and is bonded to the die pad 3, for example. The bonding material is solder, for example.

The switching element 1 has a drain electrode, which is not illustrated, on a lower surface thereof. The drain electrode and the die pad 3 are electrically connected through a bonding material.

The switching element 1 has a source electrode 21 on an upper surface thereof. The switching element 1 has, on the upper surface thereof, two gate pads, that is, a gate pad 22 and a gate pad 23.

The source electrode 21 is provided in a region on the upper surface of the switching element 1 other than a region where the gate pad 22 and the gate pad 23 are provided. The source electrode 21 occupies a wide range of a region on the upper surface of the switching element 1 other than the gate pad 22 and the gate pad 23. The source electrode 21 occupies a range equal to or more than half of the upper surface of the switching element 1, for example. The source electrode 21 occupies a range equal to or more than 75% of the upper surface of the switching element 1, for example.

The switching element 1 is a switching element to control a current flowing between the source electrode 21 and the drain electrode in accordance with a gate signal input into the gate pad 22 or the gate pad 23.

The switching element 1 is a metal oxide semiconductor field effect transistor (MOSFET), an insulated gate bipolar transistor (IGBT), or a reverse-conducting IGBT (RC-IGBT), for example.

The switching element 1 is a semiconductor element containing a silicon semiconductor, a SiC semiconductor, or a GaN semiconductor, for example.

In the switching device 11a, the terminal 6 and the source electrode 21 are connected by a wire 7.

In the switching device 11b, the terminal 4 and the source electrode 21 are connected by the wire 7.

In the switching device 11a, the terminal 4 and the gate pad 22 are connected by a wire 8. In the switching device 11a, the gate pad 23 is not connected to the terminal 4 or the terminal 6. In the switching device 11a, the gate pad 22 is one example of a first gate pad, and the gate pad 23 is one example of a second gate pad.

In the switching device 11b, the terminal 6 and the gate pad 23 are connected by the wire 8. In the switching device 11b, the gate pad 22 is not connected to the terminal 4 or the terminal 6. In the switching device 11b, the gate pad 22 is one example of the second gate pad, and the gate pad 23 is one example of the first gate pad.

In the switching device 11a, the terminal 4 is a gate terminal, the terminal 5 is a drain terminal, and the terminal 6 is a source terminal That is to say, in the switching device 11a, the gate terminal as the terminal 4, the drain terminal as the terminal 5, and the source terminal as the terminal 6 are arranged in a second direction (i.e., a y direction in FIG. 1) orthogonal to the first direction in the following order: the gate terminal, the drain terminal, and the source terminal. In the switching device 11a, the drain terminal is one example of a first power terminal, and the source terminal is one example of a second power terminal.

In the switching device 11b, the terminal 4 is a source terminal, the terminal 5 is a drain terminal, and the terminal 6 is a gate terminal. That is to say, in the switching device 11b, the gate terminal as the terminal 6, the drain terminal as the terminal 5, and the source terminal as the terminal 4 are arranged in the second direction (i.e., a y direction in FIG. 2) in the following order: the source terminal, the drain terminal, and the gate terminal. In the switching device 11b, the drain terminal is one example of the first power terminal, and the source terminal is one example of the second power terminal.

As described above, the switching device 11a and the switching device 11b are switching devices differing in layout of terminals (i.e., the gate terminal, the drain terminal, and the source terminal).

When the switching device 11a or the switching device 11b is manufactured, the switching element 1 and the die pad 3 are bonded first. Then, the switching device 11a can be obtained when the terminal 4 and the gate pad 22 are connected and the terminal 6 and the source electrode 21 are connected, and the switching device 11b can be obtained when the terminal 4 and the source electrode 21 are connected and the terminal 6 and the gate pad 23 are connected. That is to say, the switching device 11a and the switching device 11b can include switching elements 1 having the same configuration and lead frames having the same configuration, for example. The lead frames are each a lead frame including the die pad 3, the terminal 4, the terminal 5, and the terminal 6. The switching device 11a and the switching device 11b can share a process of bonding the switching element 1 and the die pad 3, for example. That is to say, both the switching device 11a and the switching device 11b can be manufactured by preparing a plurality of switching elements 1, a plurality of die pads 3, a plurality of terminals 4 being non-integral with the die pads 3 and each being to be the gate terminal or the source terminal, a plurality of terminals 5 being integral with the die pads and each being to be the drain terminal, and a plurality of terminals 6 being non-integral with the die pads 3 and each being to be the source terminal or the gate terminal, arranging the switching elements 1 over the respective die pads 3, and switching between connecting the terminal 4 and the gate pad 22 by the wire 8 and connecting the terminal 6 and the gate pad 23 by the wire 8.

In the switching device 11a, the gate pad 22 is closer to the terminal 4 as the gate terminal than the gate pad 23 is. In the switching device 11a, the gate pad 23 is closer to the terminal 6 as the source terminal than the gate pad 22 is. In the switching device 11b, the gate pad 23 is closer to the terminal 6 as the gate terminal than the gate pad 22 is. In the switching device 11b, the gate pad 22 is closer to the terminal 4 as the source terminal than the gate pad 23 is. By arranging the gate pad 22 and the gate pad 23 as described above, connecting the gate pad 22 and the terminal 4 in the switching device 11a, and connecting the gate pad 23 and the terminal 6 in the switching device 11b, a difference in length of the wire 8 between the switching device 11a and the switching device 11b is suppressed, and a difference in properties between the switching device 11a and the switching device 11b is suppressed. That is to say, the switching device 11a and the switching device 11b are switching devices capable of suppressing a change in properties when the layout of terminals is changed.

An unsealed portion of the terminal 4 and an unsealed portion of the terminal 6 are deformable portions, and can be deformed to be closest to the gate pad 22 or the gate pad 23, or can be manufactured in such a state, for example. Even in such a state, however, a distance between the terminal 4 or the terminal 6 and the gate pad 22 or the gate pad 23 refers to a distance between a portion of the terminal 4 or the terminal 6 sealed by the sealing material 17 and the gate pad 22 or the gate pad 23.

In each of the switching device 11a and the switching device 11b, the gate terminal is connected to one of the gate pad 22 and the gate pad 23 closer to the gate terminal.

In each of the switching device 11a and the switching device 11b, the gate pad 22 and the gate pad 23 are arranged, on the upper surface of the switching element 1, in the second direction so that a location in the first direction of the gate pad 22 and a location in the first direction of the gate pad 23 at least partially overlap each other. The gate pad 22 and the gate pad 23 are arranged in the second direction so that the location in the first direction of the gate pad 22 and the location in the first direction of the gate pad 23 are the same, for example.

The switching element 1 is rectangular in plan view. In each of the switching device 11a and the switching device 11b, a pair of two opposing sides of the shape of the switching element 1 in plan view extends along the first direction, and a pair of the other two opposing sides thereof extends along the second direction.

The die pad 3 is rectangular in plan view. In each of the switching device 11a and the switching device 11b, a pair of two opposing sides of the shape of the die pad 3 in plan view extends along the first direction, and a pair of the other two opposing sides thereof extends along the second direction.

In each of the switching device 11a and the switching device 11b, the gate pad 22 is disposed at an end opposite an end in the second direction on the upper surface of the switching element 1, and the gate pad 23 is disposed at the end in the second direction on the upper surface of the switching element 1.

A distance (i.e., L12 in FIG. 3) in the second direction from a middle (i.e., a dashed line 81 in FIG. 3) in the second direction of the switching element 1 to the gate pad 22 and a distance (i.e., L11 in FIG. 3) in the second direction from the middle in the second direction of the switching element 1 to the gate pad 23 are the same. In the present disclosure, a case where two distances are the same refers to not only a case where the two distances are exactly the same but also a case where a larger one of the two distances is 1.1 times or less than a smaller one of the two distances. In a case where the two distances are described to be the same, a larger one of the two distances is preferably 1.05 times or less than a smaller one of the two distances. The same applies to the following paragraphs including the other embodiments.

When the gate pad 22 and the gate pad 23 are provided at an end in the first direction on the upper surface of the switching element 1, the length of the wire 8 can be reduced in each of the switching device 11a and the switching device 11b. Reduction in length of the wire 8 can lead to reduction in time required for transmission of the gate signal.

The gate pad 22 is provided at a corner on the upper surface of the switching element 1 closest to the terminal 4, and the gate pad 23 is provided at a corner on the upper surface of the switching element 1 closest to the terminal 6, for example. The switching element 1 has a rectangular shape in which the pair of two opposing sides is longer than the pair of the other two opposing sides in plan view, for example. The gate pad 22 and the gate pad 23 are provided at two corners connected by a longer side, and the longer side is provided along the second direction, so that the distance between the gate pad 22 and the terminal 4 and the distance between the gate pad 23 and the terminal 6 can be reduced.

Figure 3:
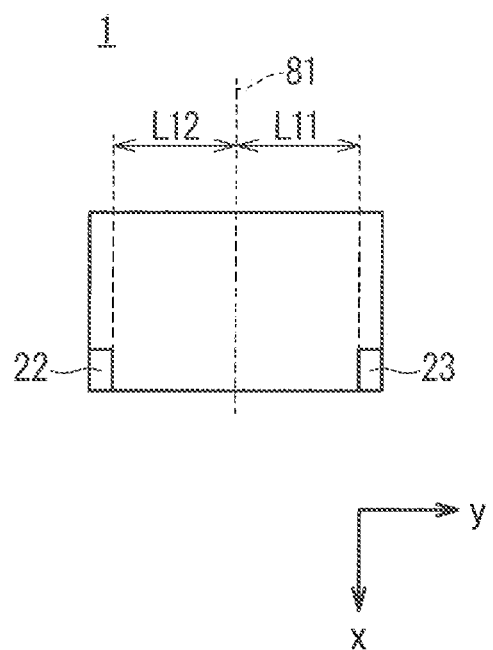
FIG. 3 shows a switching element of the switching device in Embodiment 1.

In each of the switching device 11a and the switching device 11b, the switching element 1 is disposed over the die pad 3 so that a distance (i.e., L3 in FIG. 1 or FIG. 2) in the second direction from a middle in the second direction of the die pad 3 (i.e., a dashed line 80 in FIG. 1 or FIG. 2) to an end in the second direction of the switching element 1 and a distance (i.e., L4 in FIG. 1 or FIG. 2) in the second direction from the middle in the second direction of the die pad 3 to an end opposite the end in the second direction of the switching element 1 are the same, for example. The switching element 1 is disposed over the die pad 3 so that the middle in the second direction of the die pad 3 indicated in the dashed line 80 in FIG. 1 or FIG. 2 and the middle in the second direction of the switching element 1 indicated in the dashed line 81 in FIG. 3 are coincident with each other, for example.

The terminal 4 and the terminal 6 are located on oppose sides in the second direction of the middle in the second direction of the die pad 3. A distance (i.e., L10 in FIG. 1 or FIG. 2) in the second direction from the middle in the second direction of the die pad 3 to the terminal 4 and a distance (i.e., L9 in FIG. 1 or FIG. 2) in the second direction from the middle in the second direction of the die pad 3 to the terminal 6 are the same, for example. Furthermore, a location in the first direction of an end opposite an end in the first direction of the terminal 4 and a location in the first direction of an end opposite an end in the first direction of the terminal 6 are the same, for example.

In each of the switching device 11a and the switching device 11b, the switching element 1 is disposed over the die pad 3 so that a distance (i.e., L2 in FIG. 1 or FIG. 2) in the second direction from the middle in the second direction of the die pad 3 to the gate pad 22 and a distance (i.e., L1 in FIG. 1 or FIG. 2) in the second direction from the middle in the second direction of the die pad 3 to the gate pad 23 are the same, for example.

In each of the switching device 11a and the switching device 11b, the gate pad 22 and the gate pad 23 are located to be symmetric with respect to a line (i.e., the dashed line 80) representing the middle in the second direction of the die pad 3, for example. A case where the gate pad 22 and the gate pad 23 are symmetric with respect to the line (i.e., dashed line 80) representing the middle in the second direction of the die pad 3 herein refers to a case where, when the gate pad 22 is folded with respect to the dashed line 80, the area of a region which is the union of a region of gate pad 22 folded with respect to the dashed line 80 and a region of the gate pad 23 is 1.1 times or less than the area of a portion in which the two regions overlap each other.

In each of the switching device 11a and the switching device 11b, the switching element 1 is disposed over the die pad 3 so that a distance (i.e., L5 in FIG. 1 or FIG. 2) from the end in the second direction of the switching element 1 to an end in the second direction of the die pad 3 and a distance (i.e., L6 in FIG. 1 or FIG. 2) from the end opposite the end in the second direction of the switching element 1 to an end opposite the end in the second direction of the die pad 3 are the same, for example.

Due to the above-mentioned layout, in each of the switching device 11a and the switching device 11b, a distance (i.e., L8) between the terminal 4 and the gate pad 22 and a distance (i.e., L7) between the terminal 6 and the gate pad 23 are the same, for example. Furthermore, the distance between the terminal 4 and the gate pad 22 in the switching device 11a and the distance between the terminal 6 and the gate pad 23 in the switching device 11b are the same, for example.

A change in length of the wire 8 leads to a change in time required for transmission of the gate signal. Since the distance between the terminal 4 and the gate pad 22 and the distance between the terminal 6 and the gate pad 23 are the same, the difference in length of the wire 8 between the switching device 11a and the switching device 11b is further suppressed. The difference in properties between the switching device 11a and the switching device 11b can thereby be further suppressed.

In each of the switching device 11a and the switching device 11b, the terminal 5 as the drain terminal is present between the terminal 4 and the terminal 6, and the terminal 4 and the terminal 6 are located away from each other in the second direction. In this case, a large effect is obtained by suppressing the difference in length of the wire 8 between the switching device 11a and the switching device 11b due to the presence of both the gate pad 22 and the gate pad 23.

A switching element containing the SiC semiconductor or the GaN semiconductor is more suitable for fast switching than a switching element containing the silicon semiconductor. When the switching element 1 is an element to perform fast switching, the length of the wire 8 has a large influence on switching properties. Thus, when the switching element 1 is the switching element containing the SiC semiconductor or the GaN semiconductor, it is more effective to suppress the difference in properties between the switching device 11a and the switching device 11b by suppressing the difference in length of the wire 8 between the switching device 11a and the switching device 11b as in the present embodiment.

B. Embodiment 2

<B-1. Configuration>

Figure 4:
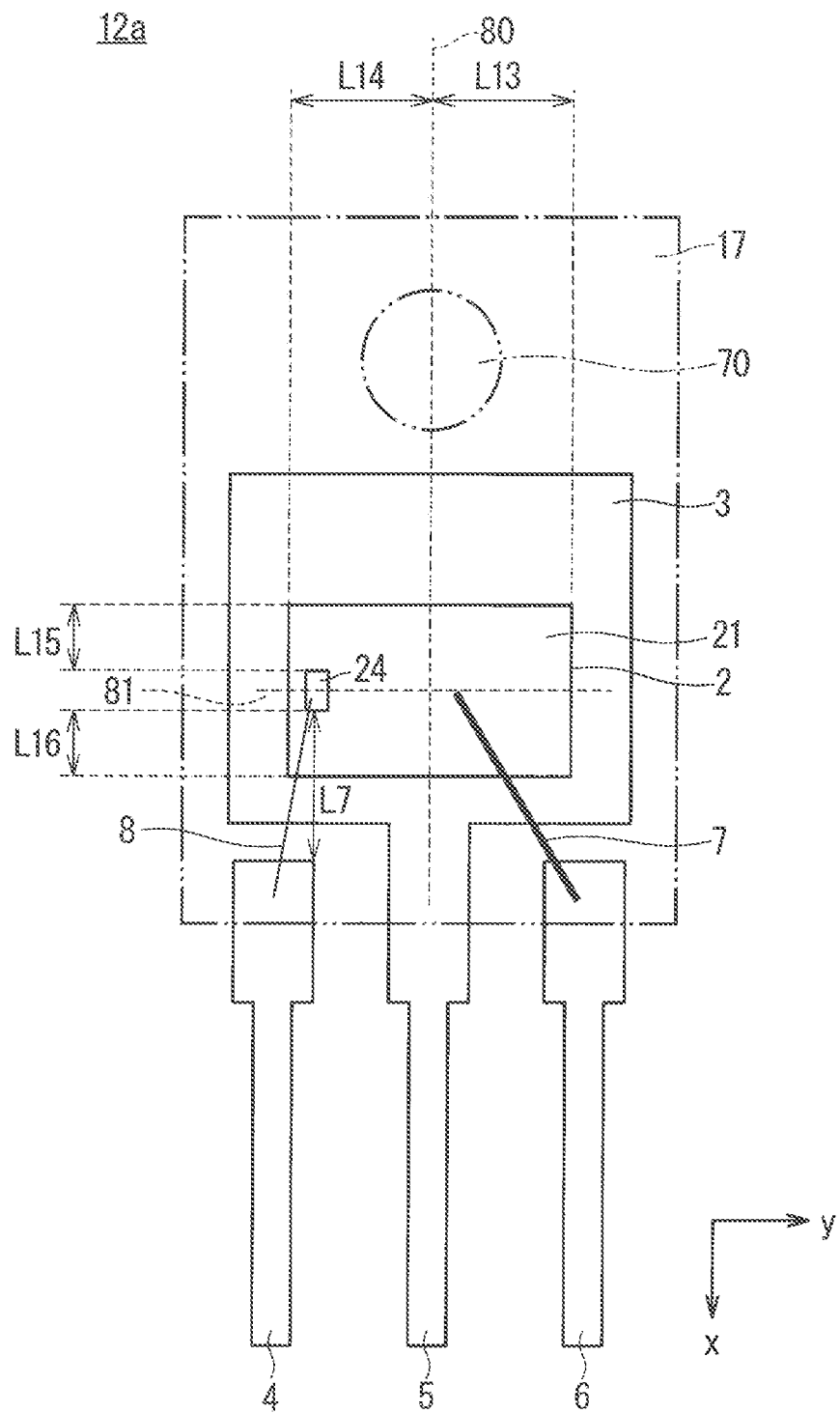
FIG. 4 shows one example of a switching device in Embodiment 2.
Figure 5:
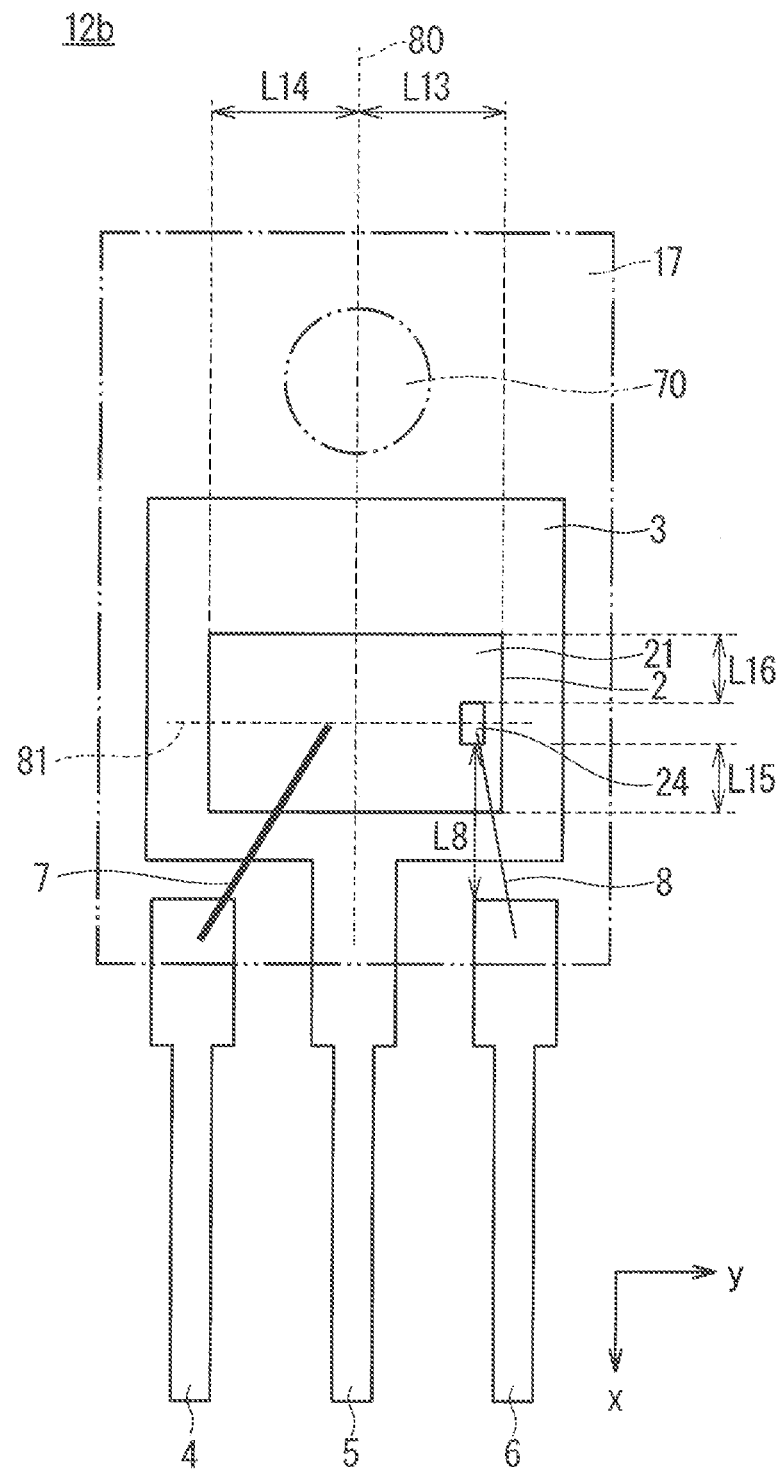
FIG. 5 shows one example of the switching device in Embodiment 2.

FIGS. 4 and 5 respectively show a switching device 12a and a switching device 12b each being a switching device in the present embodiment.

The switching device 12a differs from the switching device 11a in Embodiment 1 in that a switching element 2 is included in place of the switching element 1. In the switching device 12a, the terminal 4 and a gate pad 24 of the switching element 2 are connected by the wire 8. The switching device 12a is similar to the switching device 11a in Embodiment 1 in the other respects.

The switching device 12b differs from the switching device 11b in Embodiment 1 in that the switching element 2 is included in place of the switching element 1. In the switching device 12b, the terminal 6 and the gate pad 24 of the switching element 2 are connected by the wire 8. The switching device 12b is similar to the switching device 11b in Embodiment 1 in the other respects.

The switching element 2 is disposed over the die pad 3. The switching element 2 is disposed over the die pad 3 through a bonding material, and is bonded to the die pad 3, for example. The bonding material is solder, for example.

The switching element 2 has a drain electrode, which is not illustrated, on a lower surface thereof. The drain electrode and the die pad 3 are electrically connected through a bonding material.

The switching element 2 has the source electrode 21 on an upper surface thereof. The switching element 2 has the gate pad 24 on the upper surface thereof.

The source electrode 21 is provided in a region on the upper surface of the switching element 2 other than a region where the gate pad 24 is provided. The source electrode 21 occupies a wide range of a region on the upper surface of the switching element 2 other than the gate pad 24. The source electrode 21 occupies a range equal to or more than half of the upper surface of the switching element 2, for example. The source electrode 21 occupies a range equal to or more than 75% of the upper surface of the switching element 2, for example.

The switching element 2 is a switching element to control a current flowing between the source electrode 21 and the drain electrode in accordance with a gate signal input into the gate pad 24.

In each of the switching device 12a and the switching device 12b, the terminal 4, the terminal 5, and the terminal 6 are located on a side of the first direction (i.e., an x direction in FIG. 4 or FIG. 5) of the die pad 3. The terminal 4, the terminal 5, and the terminal 6 extend along the first direction. The terminal 4, the terminal 5, and the terminal 6 protrude from the sealing material 17 in the first direction.

In the switching device 12a, the terminal 4 is the gate terminal, the terminal 5 is the drain terminal, and the terminal 6 is the source terminal. That is to say, in the switching device 12a, the gate terminal as the terminal 4, the drain terminal as the terminal 5, and the source terminal as the terminal 6 are arranged in the second direction (i.e., a y direction in FIG. 4) orthogonal to the first direction in the following order: the gate terminal, the drain terminal, and the source terminal.

In the switching device 12b, the terminal 4 is the source terminal, the terminal 5 is the drain terminal, and the terminal 6 is the gate terminal. That is to say, in the switching device 12b, the gate terminal as the terminal 6, the drain terminal as the terminal 5, and the source terminal as the terminal 4 are arranged in the second direction (i.e., a y direction in FIG. 5) in the following order: the source terminal, the drain terminal, and the gate terminal.

As described above, the switching device 12a and the switching device 12b are switching devices differing in layout of terminals (i.e., the gate terminal, the drain terminal, and the source terminal).

When the switching device 12a or the switching device 12b is manufactured, the switching element 2 and the die pad 3 are bonded first. In this case, an orientation of the switching element 2 is switched depending on whether to manufacture the switching device 12a or the switching device 12b. When the switching element 2 is bonded to the die pad 3 in an orientation shown in FIG. 4, the terminal 4 is connected to the gate pad 24, and the terminal 6 is connected to the source electrode 21, the switching device 12a can be obtained. When the switching element 2 is bonded to the die pad 3 in an orientation shown in FIG. 5, the terminal 4 is connected to the source electrode 21, and the terminal 6 is connected to the gate pad 24, the switching device 12b can be obtained.

The switching device 12a and the switching device 12b can include switching elements 2 having the same configuration and lead frames having the same configuration, for example. The lead frames are each a lead frame including the die pad 3, the terminal 4, the terminal 5, and the terminal 6. If the switching element 2 changes little in shape in an orientation in the switching device 12a and in an orientation in the switching device 12b, the switching device 12a and the switching device 12b can share a process of bonding the switching element 2 and the die pad 3, for example.

Both the switching device 12a and the switching device 12b can be manufactured by preparing a plurality of switching elements 2, a plurality of die pads 3, a plurality of terminals 4 being non-integral with the die pads 3 and each being to be the gate terminal or the source terminal, a plurality of terminals 5 being integral with the die pads and each being to be the drain terminal, and a plurality of terminals 6 being non-integral with the die pads 3 and each being to be the source terminal or the gate terminal, arranging the switching elements 2 over the respective die pads 3, and switching between disposing the switching element 2 over the die pad 3 in an orientation in which the gate pad 24 is located closer to the terminal 4 than the middle in the second direction of the switching element 2 is and connecting the gate pad 24 and the terminal 4 by the wire 8 or disposing the switching element 2 over the die pad 3 in an orientation in which the gate pad 24 is located closer to the terminal 6 than the middle in the second direction of the switching element 2 is and connecting the gate pad 24 and the terminal 6 by the wire 8.

In the switching device 12a, the gate pad 24 is disposed to include a middle in the first direction of the upper surface of the switching element 2. A distance (i.e., L16 in FIG. 4) in the first direction from an end in the first direction of the switching element 2 to the gate pad 24 and a distance (i.e., L15 in FIG. 4) in the first direction from an end opposite the end in the first direction of the switching element 2 to the gate pad 24 are the same, for example. Furthermore, the gate pad 24 is disposed, on the upper surface of the switching element 2, to be closer to the terminal 4 than the middle in the second direction of the switching element 2 is.

In the switching device 12b, the gate pad 24 is disposed to include the middle in the first direction of the upper surface of the switching element 2. A distance (i.e., L15 in FIG. 5) in the first direction from the end in the first direction of the switching element 2 to the gate pad 24 and a distance (i.e., L16 in FIG. 5) in the first direction from the end opposite the end in the first direction of the switching element 2 to the gate pad 24 are the same, for example. Furthermore, the gate pad 24 is disposed, on the upper surface of the switching element 2, to be closer to the terminal 6 than the middle in the second direction of the switching element 2 is.

Since the gate pad 24 is provided in the middle in the first direction of the upper surface of the switching element 2, a difference in length of the wire 8 between the switching device 12a and the switching device 12b can be suppressed.

In each of the switching device 12a and the switching device 12b, the switching element 2 is disposed in an orientation in which the gate pad 24 is located to be closer to the gate terminal in the second direction than the middle in the second direction of the switching element 2 is. The length of the wire 8 can thereby be reduced.

In the switching device 12a, a distance between the gate pad 24 and the terminal 4 is smaller than a distance between the gate pad 24 and the terminal 6, and, when the switching element 2 is imaginarily rotated about the center of the switching element 2 180° in a plane of the switching element 2, the distance between the gate pad 24 and the terminal 6 is smaller than the distance between the gate pad 24 and the terminal 4.

In the switching device 12b, the distance between the gate pad 24 and the terminal 6 is smaller than the distance between the gate pad 24 and the terminal 4, and, when the switching element 2 is imaginarily rotated about the center of the switching element 2 180° in the plane of the switching element 2, the distance between the gate pad 24 and the terminal 4 is smaller than the distance between the gate pad 24 and the terminal 6.

That is to say, in each of the switching device 12a and the switching device 12b, the gate pad 24 is provided in a region including the middle in the first direction of the upper surface of the switching element 2, the distance between the gate pad 24 and the gate terminal is smaller than the distance between the gate pad 24 and the source terminal, and, when the switching element 2 is imaginarily rotated about the center of the switching element 2 180° in the plane of the switching element 2, the distance between the gate pad 24 and the source terminal is smaller than the distance between the gate pad 24 and the gate terminal. Thus, the difference in length of the wire 8 between the switching device 12a and the switching device 12b can be suppressed, and the difference in properties between the switching device 12a and the switching device 12b can be suppressed. That is to say, the switching device 12a and the switching device 12b are switching devices capable of suppressing a change in properties when the layout of terminals is changed.

An orientation of the switching element 2 in the switching device 12b is an orientation of the switching element 2 when the switching element 2 in the switching device 12a is rotated about the center of the switching element 2 180° in the plane of the switching element 2.

Figure 6:
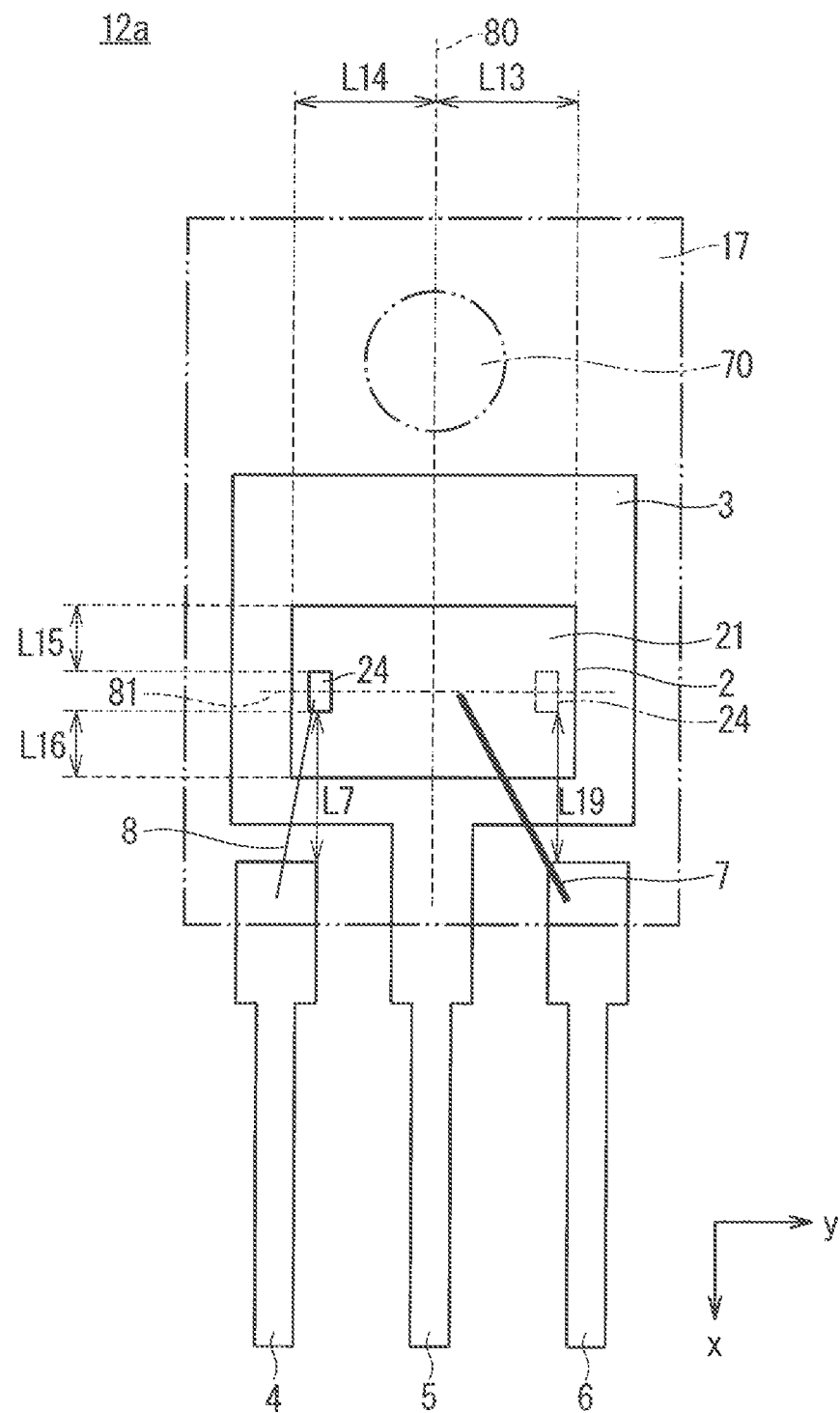
FIG. 6 shows an orientation of a gate pad when a switching element is imaginarily rotated in the example of the switching device in Embodiment 2.

In the switching device 12a, the distance (i.e., L7 in FIG. 6) between the gate pad 24 and the terminal 4 and the distance (i.e., L19 in FIG. 6) between the gate pad 24 and the terminal 6 when the switching element 2 is imaginarily rotated about the center of the switching element 2 180° in the plan of the switching element 2 are the same, for example. In FIG. 6, a location of the gate pad 24 when the switching element 2 is imaginarily rotated about the center of the switching element 2 180° in the plane of the switching element 2 is indicated in an alternate long and two short dashes line.

Similarly, in the switching device 12b, the distance between the gate pad 24 and the terminal 6 and the distance between the gate pad 24 and the terminal 4 when the switching element 2 is imaginarily rotated about the center of the switching element 2 180° in the plane of the switching element 2 are the same, for example.

In each of the switching device 12a and the switching device 12b, the switching element 2 is disposed over the die pad 3 so that a distance (i.e., L13 in FIG. 4 or FIG. 5) in the second direction from the middle (i.e., dashed line 80 in FIG. 4 or FIG. 5) in the second direction of the die pad 3 to an end in the second direction of the switching element 2 and a distance (i.e., L14 in FIG. 4 or FIG. 5) in the second direction from the middle in the second direction of the die pad 3 to an end opposite the end in the second direction of the switching element 2 are the same.

Due to the above-mentioned layout, the distance (i.e., L7 in FIG. 4) between the gate pad 24 and the terminal 4 in the switching device 12a and the distance (i.e., L8 in FIG. 5) between the gate pad 24 and the terminal 6 in the switching device 12b can be the same.

Since the distance between the gate pad 24 and the terminal 4 in the switching device 12a and the distance between the gate pad 24 and the terminal 6 in the switching device 12b are the same, the difference in length of the wire 8 between the switching device 12a and the switching device 12b is suppressed. The difference in properties between the switching device 12a and the switching device 12b can thereby be further suppressed.

C. Embodiment 3

<C-1. Configuration>

Figure 9:
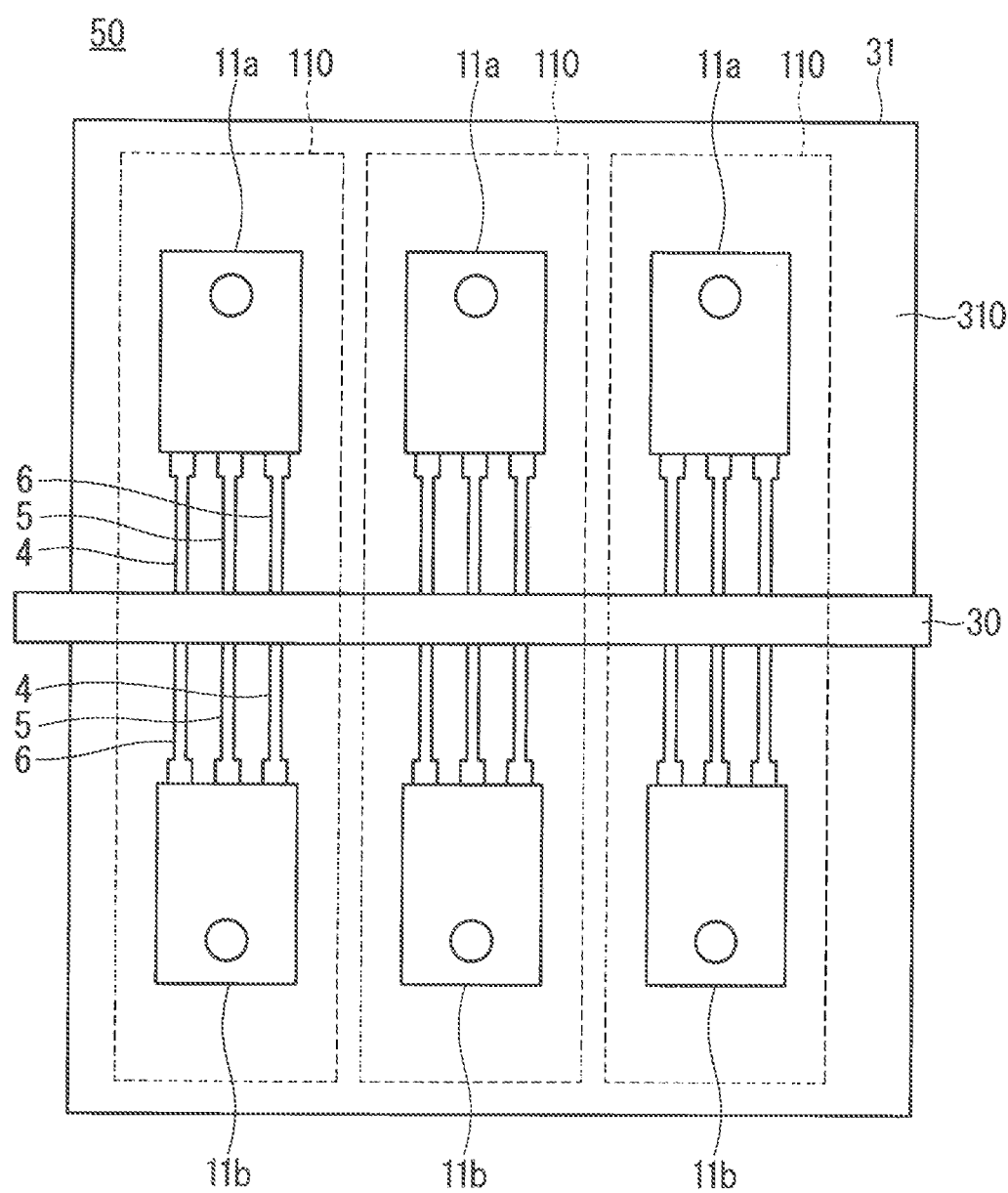
FIG. 9 shows a switching device in Embodiment 3.

FIG. 9 shows a semiconductor device 50 in the present embodiment. The semiconductor device 50 includes a substrate 30, switching devices 11a (examples of a first switching device), switching devices 11b (examples of a second switching device), and a heat sink 31. The semiconductor device 50 is a power converter, for example.

The substrate 30 extends in a direction perpendicular to the plane of FIG. 9.

In the semiconductor device 50, the switching devices 11a are arranged on a side of one main surface of the substrate 30, and the switching devices 11b are arranged on a side of the other main surface of the substrate 30.

While three pairs 110 of a switching device 11a and a switching device 11b are shown in FIG. 9, the semiconductor device 50 is only required to include one or more pairs 110 of a switching device 11a and a switching device 11b. The pairs 110 are not required to be pairs of a switching device 11a and a switching device 11b, and may be pairs of a switching device 12a and a switching device 12b. One or more pairs of the pairs 110 may be pairs of a switching device 11a and a switching device 11b and the other one or more pairs of the pairs 110 may be pairs of a switching device 12a and a switching device 12b. In each of one or more pairs of the pairs 110, the switching device 11a may be disposed on a side of one surface of the substrate 30, and the switching device 11b may be disposed on a side of the other surface of the substrate 30, and, in each of the other one or more pairs of the pairs 110, the switching device 11b may be disposed on the side of the one surface of the substrate 30, and the switching device 11a may be disposed on the side of the other surface of the substrate 30.

In each of the pairs 110, the switching device 11a and the switching device 11b are connected in parallel. In such a parallel connection between two switching devices, the two switching devices preferably have a smaller difference in properties. As described in Embodiment 1, the switching device 11a and the switching device 11b are switching devices having a suppressed difference in properties. A longer one of the wire 8 of the switching device 11a and the wire 8 of the switching device 11b is preferably 1.1 times or less than a shorter one of the wire 8 of the switching device 11a and the wire 8 of the switching device 11b, and is more preferably 1.05 times or less than the shorter one of the wire 8 of the switching device 11a and the wire 8 of the switching device 11b.

The terminal 6 as the gate terminal, the terminal 5 as the drain terminal, and the terminal 4 as the source terminal of the switching device 11b are arranged along a direction in which the terminal 4 as the gate terminal, the terminal 5 as the drain terminal, and the terminal 6 as the source terminal of the switching device 11a are arranged in an in-plane direction of the substrate 30 in the same order as the order in which the terminal 4 as the gate terminal, the terminal 5 as the drain terminal, and the terminal 6 as the source terminal of the switching device 11a are arranged. By mounting two switching elements on opposite surfaces of the substrate 30, and connecting them in parallel as described above, wiring of the substrate 30 is simplified. By arranging switching elements on the opposite surfaces of the substrate 30, the substrate 30 can be reduced in size.

When the switching devices 11a and the switching devices 11b are mounted on the substrate 30 as described above, the switching element 1 of each of the switching devices 11a and the switching element 1 of each of the switching devices 11b are located on the same side, that is, a side in front of the plane of FIG. 9, of the die pads 3 in the in-plane direction of the substrate 30.

The heat sink 31 is located on a side behind the plane of FIG. 9 of each of the switching devices 11a and the switching devices 11b. The heat sink 31 protrudes in a direction perpendicular to the plane of the substrate 30 on sides of the opposite surfaces of the substrate 30. The heat sink 31 has a cooling surface 310 in an orientation crossing the substrate 30. The switching devices 11a and the switching devices 11b are attached to the cooling surface 310. The switching devices 11a and the switching devices 11b are attached to the same side of the heat sink 31 in the in-plane direction of the substrate 30.

The heat sink 31 may be a combination of a heat sink attached to one surface of the substrate 30 and a heat sink attached to the other surface of the substrate 30, or may be an integral heat sink attached to an end of the substrate 30, for example.

By forming parallel connections using the switching devices 11a and the switching devices 11b between which the gate terminal, the drain terminal, and the source terminal are arranged in reverse order as described above, wiring can be simplified, and the heat sink 31 can be attached to the same side of the switching devices 11a and the switching devices 11b. Thus, even when the switching devices 11a and the switching devices 11b are each a switching device required to be cooled on one side, the switching devices 11a and the switching devices 11b can easily be mounted in parallel on opposite sides of the substrate 30 as described above.

Embodiments can freely be combined with each other, and can be modified or omitted as appropriate.

While the invention has been shown and described in detail, the foregoing description is in all aspects illustrative and not restrictive. It is therefore understood that numerous modifications and variations can be devised without departing from the scope of the invention.

What is claimed is:

1. A switching device comprising:
a switching element;
a die pad;
a gate terminal non-integral with the die pad;
a first power terminal integral with the die pad; and
a second power terminal non-integral with the die pad, wherein
the switching element is disposed over the die pad,
a lower surface of the switching element and the die pad are electrically connected,
the gate terminal, the first power terminal, and the second power terminal are located on a side of a first direction of the die pad in plan view,
the gate terminal, the first power terminal, and the second power terminal are arranged in a second direction orthogonal to the first direction in plan view in the following order: the gate terminal, the first power terminal, and the second power terminal or the second power terminal, the first power terminal, and the gate terminal,
a first gate pad and a second gate pad are positioned on a same continuous upper surface of the switching element,
the first gate pad is closer to the gate terminal than the second gate pad is,
the second gate pad is closer to the second power terminal than the first gate pad is,
the first gate pad is connected to the gate terminal by a wire,
the second gate pad is not connected to the gate terminal or the second power terminal, and
a distance between the gate terminal and the first gate pad and a distance between the second power terminal and the second gate pad are the same.

2. The switching device according to claim 1, wherein
the first gate pad and the second gate pad are arranged, on the upper surface of the switching element, in the second direction so that a location in the first direction of the first gate pad and a location in the first direction of the second gate pad at least partially overlap each other.

3. The switching device according to claim 1, wherein
a distance in the second direction from a middle in the second direction of the switching element to the first gate pad and a distance in the second direction from the middle in the second direction of the switching element to the second gate pad are the same.

4. The switching device according to claim 1, wherein
a distance in the second direction from a middle in the second direction of the die pad to the first gate pad and a distance in the second direction from the middle in the second direction of the die pad to the second gate pad are the same.

5. The switching device according to claim 1, wherein
the first gate pad and the second gate pad are located to be symmetric with respect to a line representing a middle in the second direction of the die pad.

6. The switching device according to claim 1, wherein
a distance from a middle in the second direction of the die pad to an end in the second direction of the switching element and a distance from the middle in the second direction of the die pad to an end opposite the end in the second direction of the switching element are the same.

7. The switching device according to claim 1, wherein
the gate terminal and the second power terminal are located on opposite sides in the second direction of a middle in the second direction of the die pad, and
a distance in the second direction from the middle in the second direction of the die pad to the gate terminal and a distance in the second direction from the middle in the second direction of the die pad to the second power terminal are the same.

8. The switching device according to claim 1, wherein
the switching element comprises a SiC semiconductor.

9. A semiconductor device including a first switching device and a second switching device, each of the first switching device and the second switching device comprising:
a switching element;
a die pad;
a gate terminal non-integral with the die pad;
a first power terminal integral with the die pad; and
a second power terminal non-integral with the die pad, wherein
the switching element is disposed over the die pad,
a lower surface of the switching element and the die pad are electrically connected,
the gate terminal, the first power terminal, and the second power terminal are located on a side of a first direction of the die pad in plan view,
the gate terminal, the first power terminal, and the second power terminal of the first switching device are arranged in a second direction orthogonal to the first direction in plan view in the following order: the gate terminal, the first power terminal, and the second power terminal,
the gate terminal, the first power terminal, and the second power terminal of the second switching device are arranged in the second direction in plan view in the following order: the second power terminal, the first power terminal, and the gate terminal,
for each of the first switching device and the second switching device, the switching element includes a single gate pad on an upper surface thereof,
for each of the first switching device and the second switching device, the gate pad is disposed in a region, on the upper surface of the switching element, including a middle in the first direction of the switching element,
for each of the first switching device and the second switching device, a distance between the gate pad and the gate terminal is smaller than a distance between the gate pad and the second power terminal,
for each of the first switching device and the second switching device, the switching element is positioned such that, imaginarily rotating the switching element about a center of the switching element 180° in a plane of the switching element, the distance between the gate pad and the second power terminal is smaller than the distance between the gate pad and the gate terminal,
for each of the first switching device and the second switching device, the gate terminal and the gate pad are connected by a wire,
for each of the first switching device and the second switching device, the switching element is positioned such that, imaginarily rotating the switching element about the center of the switching element 180° in the plane of the switching element, the minimum distance measured directly from the gate pad to a closest point of the gate terminal before rotating and the minimum distance measured directly from the gate pad to a closest point of the second power terminal after rotating are the same,
the order of terminals in the second switching device is the same as the order of terminals in the first switching device in plan view, and
the gate terminal, the first power terminal, and the second power terminal of the first switching device point toward the gate terminal, the first power terminal, and the second power terminal of the second switching device.

10. The semiconductor device according to claim 9, wherein
a distance in the first direction from an end in the first direction of the switching element to the gate pad and a distance in the first direction from an end opposite the end in the first direction of the switching element to the gate pad are the same.

11. The semiconductor device according to claim 9, wherein
a distance from a middle in the second direction of the die pad to an end in the second direction of the switching element and a distance from the middle in the second direction of the die pad to an end opposite the end in the second direction of the switching element are the same.

12. The semiconductor device according to claim 9, wherein
the gate terminal and the second power terminal are located on opposite sides in the second direction of a middle in the second direction of the die pad, and
a distance in the second direction from the middle in the second direction of the die pad to the gate terminal and a distance in the second direction from the middle in the second direction of the die pad to the second power terminal are the same.

13. The semiconductor device according to claim 9, wherein
the switching element comprises a SiC semiconductor.

14. A semiconductor device including a first switching device and a second switching device each being the switching device according to claim 1, wherein
the gate terminal, the first power terminal, and the second power terminal of the first switching device are arranged in the second direction in the following order: the gate terminal, the first power terminal, and the second power terminal,
the gate terminal, the first power terminal, and the second power terminal of the second switching device are arranged in the second direction in the following order: the second power terminal, the first power terminal, and the gate terminal, and
the first switching device and the second switching device are connected in parallel.

15. The semiconductor device according to claim 14, further comprising
a substrate, wherein
the first switching device and the second switching device are arranged on a side of one main surface and a side of the other main surface of the substrate to oppose each other with the substrate therebetween, and the gate terminal, the first power terminal, and the second power terminal of the second switching device are arranged along a direction in which the gate terminal, the first power terminal, and the second power terminal of the first switching device are arranged in the same order as the order in which the gate terminal, the first power terminal, and the second power terminal of the first switching device are arranged.

16. The semiconductor device according to claim 15, further comprising
a heat sink, wherein
the first switching device and the second switching device are attached to the same side of the heat sink in an in-plane direction of the substrate.

17. The semiconductor device according to claim 9, wherein
the first switching device and the second switching device are connected in parallel.

18. The semiconductor device according to claim 17, further comprising
a substrate, wherein
the first switching device and the second switching device are arranged on a side of one main surface and a side of the other main surface of the substrate to oppose each other with the substrate therebetween.

19. The semiconductor device according to claim 18, further comprising
a heat sink, wherein
the first switching device and the second switching device are attached to the same side of the heat sink in an in-plane direction of the substrate.

20. A switching device manufacturing method for manufacturing a plurality of switching devices each being the switching device according to claim 1, the method comprising:
preparing a plurality of the switching element, a plurality of the die pad, a plurality of first terminals non-integral with the die pads, a plurality of second terminals integral with the die pads, and a plurality of third terminals non-integral with the die pads, the first terminals each to be the gate terminal or the second power terminal, the second terminals each to be the first power terminal, the third terminals each to be the second power terminal or the gate terminal;
arranging the plurality of switching elements over respective ones of the die pads; and
manufacturing both a first switching device in which the gate terminal, the first power terminal, and the second power terminal are arranged in the second direction in the following order: the gate terminal, the first power terminal, and the second power terminal and a second switching device in which the gate terminal, the first power terminal, and the second power terminal are arranged in the second direction in the following order: the second power terminal, the first power terminal, and the gate terminal by switching between connecting the first terminal and the first gate pad by a wire and connecting the third terminal and the second gate pad by a wire.

21. A switching device manufacturing method for manufacturing the semiconductor device according to claim 9, the method comprising:
preparing a plurality of the switching element, a plurality of the die pad, a plurality of first terminals non-integral with the die pads, a plurality of second terminals integral with the die pads, and a plurality of third terminals non-integral with the die pads, the first terminals each to be the gate terminal of the first switching device or the second power terminal of the second switching device, the second terminals each to be the first power terminal, and the third terminals each to be the second power terminal of the first switching device or the gate terminal of the second switching device;
arranging the plurality of switching elements over respective ones of the die pads; and
manufacturing both the first switching device in which the gate terminal, the first power terminal, and the second power terminal are arranged in the second direction in the following order: the gate terminal, the first power terminal, and the second power terminal and the second switching device in which the gate terminal, the first power terminal, and the second power terminal are arranged in the second direction in the following order: the second power terminal, the first power terminal, and the gate terminal by arranging one of the switching elements over the die pad so that the gate pad is located on a side of the first terminal of a middle in the second direction of the switching element and connecting the gate pad and the first terminal by a wire and arranging another of the switching elements over the die pad so that the gate pad is located on a side of the third terminal of the middle in the second direction of the switching element and connecting the gate pad and the third terminal by a wire.

22. The switching device according to claim 1, wherein
the first gate pad and the second gate pad are positioned in corners of the upper surface of the switching element.

23. The semiconductor device according to claim 9, wherein
the first switching device and the second switching device are positioned in opposite orientations such that the gate terminal, the first power terminal, and the second power terminal of the first switching device and the second switching device point in opposite directions.

* * * * *